(12) United States Patent
Bowers et al.

(10) Patent No.: US 8,412,985 B1
(45) Date of Patent: *Apr. 2, 2013

(54) HARDWIRED REMAPPED MEMORY

(75) Inventors: Stephen Bowers, Woodland, CA (US);
Gurkirat Billing, Lincoln, CA (US);
Samuel David Post, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 178 days.

This patent is subject to a terminal disclaimer.

(21) Appl. No.: 12/494,830

(22) Filed: Jun. 30, 2009

(51) Int. Cl.
*G06F 11/00* (2006.01)

(52) U.S. Cl. .......... 714/42; 714/6.3; 714/6.32; 714/710; 714/711

(58) Field of Classification Search .................. None
See application file for complete search history.

(56) References Cited

U.S. PATENT DOCUMENTS

| | | | |
|---|---|---|---|
| 4,335,459 A | 6/1982 | Miller | |
| 5,363,484 A | 11/1994 | Desnoyers et al. | |
| 5,418,796 A | 5/1995 | Price et al. | |
| 5,434,868 A | 7/1995 | Aichelmann, Jr. et al. | |
| 5,465,262 A | 11/1995 | Dell et al. | |
| 5,530,673 A * | 6/1996 | Tobita et al. ............. | 365/185.09 |
| 5,764,878 A | 6/1998 | Kablanian et al. | |
| 5,867,642 A | 2/1999 | Vivio et al. | |
| 5,974,564 A | 10/1999 | Jeddeloh | |
| 6,006,306 A | 12/1999 | Haywood et al. | |
| 6,067,262 A | 5/2000 | Irrinki et al. | |
| 6,236,602 B1 | 5/2001 | Patti | |
| 6,339,546 B1 | 1/2002 | Katayama et al. | |
| 6,467,048 B1 | 10/2002 | Olarig et al. | |
| 6,525,966 B1 | 2/2003 | Hollmer et al. | |
| 6,539,506 B1 | 3/2003 | Lammers et al. | |
| 6,651,202 B1 | 11/2003 | Phan | |
| 6,848,070 B1 | 1/2005 | Kumar | |
| 6,941,505 B2 * | 9/2005 | Yada et al. .................... | 714/763 |
| 7,043,672 B2 * | 5/2006 | Merritt ......................... | 714/711 |
| 7,233,054 B1 * | 6/2007 | Anh et al. ..................... | 257/613 |
| 7,346,815 B2 | 3/2008 | Nowicki | |
| 7,373,562 B2 * | 5/2008 | Poechmueller .............. | 714/710 |
| 7,434,122 B2 * | 10/2008 | Jo ................................. | 714/723 |
| 7,467,337 B2 | 12/2008 | Nakamura et al. | |
| 7,519,875 B2 * | 4/2009 | Rearick et al. ............... | 714/710 |
| 7,644,323 B2 | 1/2010 | Wu et al. | |
| 7,661,004 B2 | 2/2010 | May et al. | |
| 7,757,135 B2 | 7/2010 | Nadeau-Dostie et al. | |
| 7,858,960 B2 | 12/2010 | Chang | |
| 7,908,530 B2 | 3/2011 | Chen | |
| 2001/0004326 A1 | 6/2001 | Terasaki | |
| 2004/0024961 A1 | 2/2004 | Cochran et al. | |

(Continued)

OTHER PUBLICATIONS

Patent Application filed Jun. 30, 2009 in co-pending U.S. Appl. No. 12/495,032, 41 pages.

(Continued)

*Primary Examiner* — Michael Maskulinski
(74) *Attorney, Agent, or Firm* — Knobbe, Martens, Olson & Bear LLP (57) ABSTRACT

Subject matter disclosed herein relates to on-the-fly remapping a memory device by hardware-switching data paths to locations of the memory device.

18 Claims, 5 Drawing Sheets

U.S. PATENT DOCUMENTS

| | | |
|---|---|---|
| 2005/0120265 A1 | 6/2005 | Pline et al. |
| 2006/0156192 A1 | 7/2006 | Nakamura et al. |
| 2007/0006048 A1* | 1/2007 | Zimmer et al. ............ 714/42 |
| 2007/0038906 A1* | 2/2007 | Lakhani et al. ............ 714/710 |
| 2008/0010435 A1 | 1/2008 | Smith et al. |
| 2008/0049514 A1 | 2/2008 | Mondello et al. |
| 2009/0063914 A1 | 3/2009 | Owsley et al. |
| 2009/0132876 A1 | 5/2009 | Freking et al. |
| 2009/0287956 A1* | 11/2009 | Flynn et al. ............ 714/6 |
| 2010/0037005 A1 | 2/2010 | Kim et al. |
| 2010/0107004 A1* | 4/2010 | Bottelli et al. ............ 714/6 |

OTHER PUBLICATIONS

Patent Application filed Jun. 30, 2009 in co-pending U.S. Appl. No. 12/494,904, 31 pages.

Patent Application filed Jun. 30, 2009 in co-pending U.S. Appl. No. 12/494,994, 49 pages.

Patent Application filed Jun. 30, 2009 in co-pending U.S. Appl. No. 12/495,081, 31 pages.

Patent Application filed Jun. 30, 2009 in co-pending U.S. Appl. No. 12/494,950, 36 pages.

* cited by examiner

HARDWIRED REMAPPED MEMORY

BACKGROUND

1. Field

Subject matter disclosed herein relates to on-the-fly remapping a memory device by hardware-switching data paths to locations of the memory device.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Such nonvolatile memory devices may comprise memory cells that slowly deteriorate over time, leading to an increasing probability that a read and/or write error may occur upon accessing such a memory cell. Though such errors may be subsequently corrected within a memory device, for example, such error correction may become difficult or impossible as the number of errors increases.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device may comprise memory cells that slowly deteriorate over time, which may lead to an increased probability that one or more errors may occur while reading such a memory device. Such errors may be corrected in several areas within a computing system, for example, using error correction codes (ECC) or other such algorithms. From a system perspective, a determination may be made as to whether or not to continue to utilize such error-prone cells. As will be explained in further detail below, such a determination may be based, at least in part, on a comparison of the number of such errors to an error threshold, which may be defined during a design stage of a memory device, for example. In one implementation, use of particular memory cells may be discontinued before such cells display an excess number of errors. In other words, use of error-prone memory cells may be discontinued if such memory cells produce a number of errors that approaches an error threshold. Such a threshold need not be reached, for example, in order to determine that use of such memory cells may be discontinued. Accordingly, observing a number of errors approaching an error threshold may be a way to predict that particular memory cells may soon produce too many errors, so use of such error-prone memory cells may be stopped before the memory cells actually begin to critically malfunction, for example. If use of particular memory cells is to be discontinued, then replacement memory cells may be selected in a manner that maintains an overall memory device capacity.

Accordingly, in one embodiment, a process to maintain a size capacity of a memory device may include remapping an error-prone memory location to a properly functioning memory location, without a loss of overall system memory space (e.g., storage device capacity). Here, remapping refers to a process of redirecting read/write signals to accommodate a new use of a substitute memory location to replace a discontinued memory location. Such remapping may be based, at least in part, on information regarding a quantity and/or frequency of errors occurring as a result of reading from an error-prone memory location. Here, memory location refers to a portion of a memory device that may be accessed, e.g., via a read and/or write process, using an address to identify such a memory location and/or portion. As explained in further detail below, an ECC decoder, for example, may be used to determine a bit error rate and/or the number of bit errors associated with reading a particular portion of a memory. Subsequently, the bit error rate and/or number of bit errors may be compared to an error threshold, which may represent a substantial limit to an acceptable number of errors, for example. Depending on an outcome of such a comparison, a decision may be made regarding whether to retire, e.g., discontinue use of, the particular portion of memory producing the errors.

In a particular embodiment, a process of retiring a portion of a memory device may include moving data stored in the to-be-retired portion of the memory device to another portion of the memory device. In one implementation, data relocated from a retired portion of a memory device may be moved to a spare portion of the memory device. For example, such a spare portion of memory may include a physical location of the memory device not initially recognized or considered as part of the full capacity of the memory device, as explained in more detail below. A process of retiring a portion of a memory device may also include physically redirecting a data path so that read/write data is directed to a spare portion of memory instead of the corresponding retired portion of memory. Here, physically redirecting a data path may comprise providing a path selection signal to a hardware switching component to select a data path among two or more data path options, as explained in detail below. Information used to select one or more data paths may be determined and/or stored in a special-purpose register, for example. Such data path selection may occur on-the-fly while processing read/write instructions. Additionally, data path selection may be performed in a process that is transparent with respect to a processor that issues such read/write instructions. Here, transparency refers to a process that occurs substantially without processor involvement. Accordingly, a processor need not be burdened (e.g., slowed down) with software processes to reorganize and/or work with memory maps while processing read/write instructions, for example. Also, a processor, as used herein, may comprise a device that may read and/or write from/to memory, such as a micro controller, for example. Of course, such processes are merely examples, and claimed subject matter is not so limited.

In one embodiment, a process such as that described above may involve a memory device comprising a phase-change memory (PCM) device. Accordingly, as a PCM ages, a bit error rate and/or a number of bit errors produced by portions of the PCM may increase. Such errors, to some extent, may be corrected using an ECC decoder and/or other such error correcting algorithms, for example. However, a number of errors may increase beyond a capability of such error-correcting techniques. Therefore, it may be desirable to retire such memory portions upon an indication that such memory portions have been or are beginning to produce an excessive number of errors.

Embodiments, such as those described above, may allow successful use of storage devices involving relatively less reliable technologies, such as currently disregarded die or PCM die having less than reliable test results, for example. Also, such embodiments may extend a lifetime of a storage device to that of a majority of its memory cells rather than the life of a relatively few of its memory cells. In addition, while extending storage device lifetime, above-described embodiments may be implemented in a manner that is transparent to a processor reading/writing to/from such a storage device. Such an advantage may avoid latencies that may otherwise occur if a processor is used to carryout remapping embodiments as described above, for example.

Figure 1:
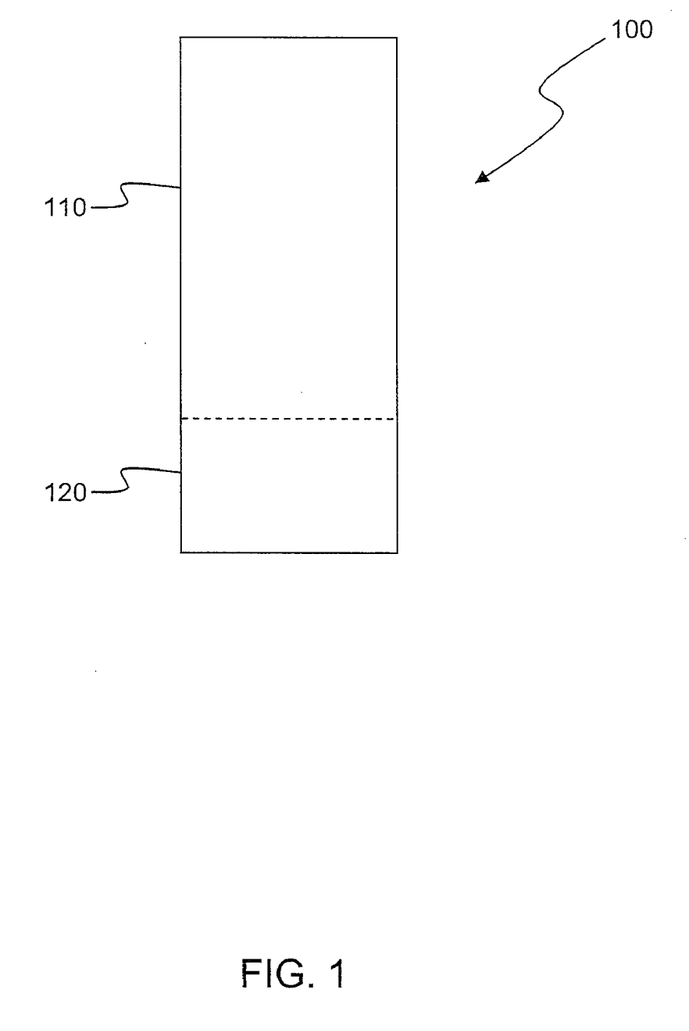
FIG. 1 is a schematic view of a memory configuration, according to an embodiment.

FIG. 1 is a schematic view of a memory configuration, according to an embodiment. A memory device 100 may be partitioned into a main memory 110 and a spare memory 120. Memory device 100 may comprise NAND or NOR flash memories, SRAM, DRAM, or PCM, just to name a few examples. Memory device 100 may comprise a user-addressable memory space including such main and spare memory portions and/or one or more other memory portions, which may or may not be contiguous with one another, and may or may not reside on a single device. Main memory 110 and spare memory 120 may comprise independent addressable spaces that may be accessed by read, write, and/or erase processes, for example.

According to an embodiment, one or more portions of memory device 100 may store signals representative of data and/or information as expressed by a particular state of memory device 100. For example, an electronic signal representative of data and/or information may be "stored" in a portion of memory device by affecting or changing the state of such portions of memory device 100 to represent data and/or information as binary information (e.g., ones and zeros). As such, in a particular implementation, such a change of state of the portion of memory to store a signal representative of data and/or information constitutes a transformation of memory device 100 to a different state or thing.

Memory device 100 may be configured to initially comprise main memory 110 corresponding to the fully usable capacity of memory device 100. Such an initial configuration may additionally comprise spare memory 120 that need not be included in determining memory device capacity. However, if portions of main memory become unusable or result in an excess number of errors during read/write processes, for example, spare memory 120 may be used to replace portions of main memory 110. Of course, details of such a memory configuration are merely examples, and claimed subject matter is not so limited.

Figure 2:
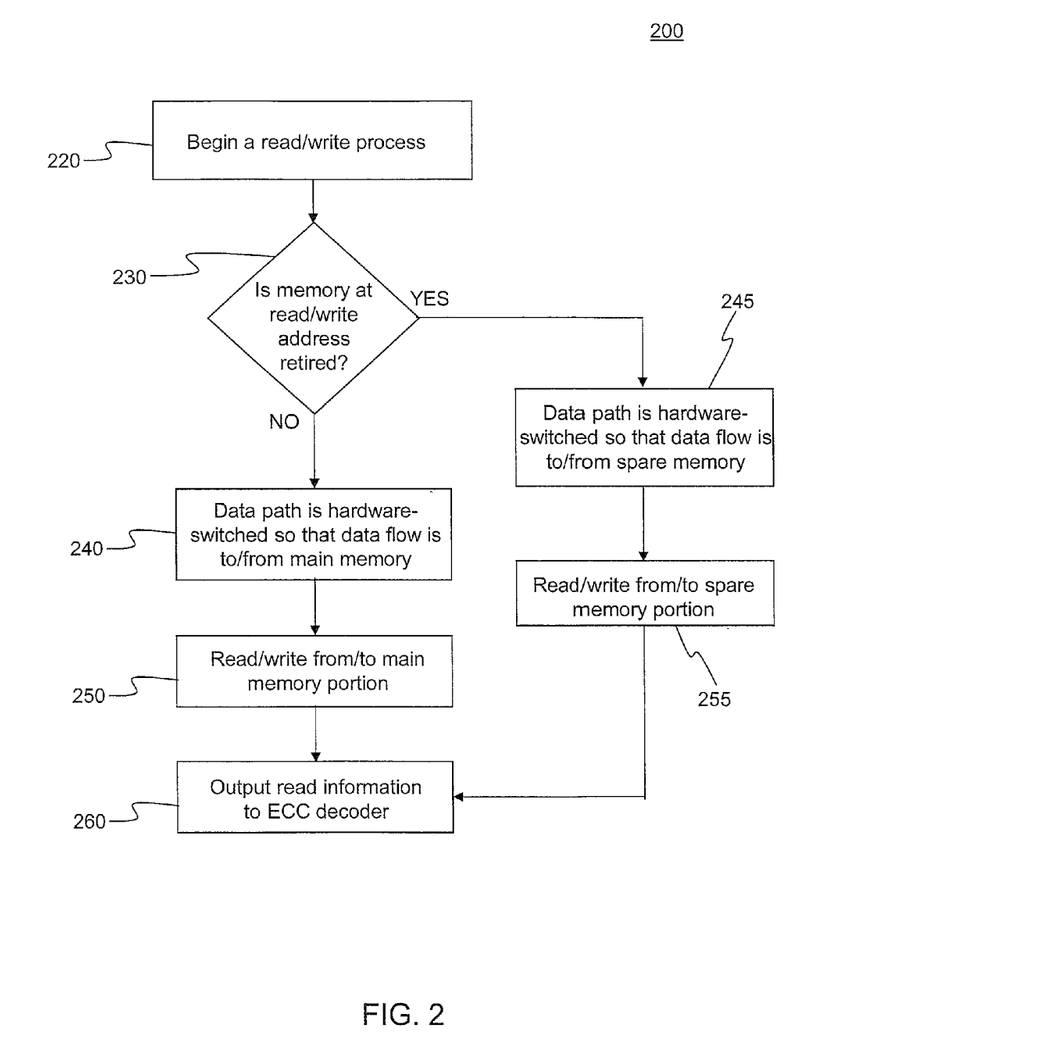
FIG. 2 is a flow diagram of a memory read/write process, according to an embodiment.

FIG. 2 is a flow diagram of a memory read/write process 200, according to an embodiment. At block 220, a read/write process to read or write to a portion of a memory device may be initiated, for example, by a system application executed by a processor (not shown) providing one or more read/write addresses to respectively identify one or more memory locations from where stored data is to be read or to where data is to be written. Beginning at block 230, such a read/write address may direct a data read/write process along a data path previously selected based, at least in part, on whether the read/write address corresponds to a memory location that has been retired. In the present example, a memory device may comprise a main memory portion and a spare memory portion, such as memory device 100 shown in FIG. 1, for example. In a particular implementation, a spare memory portion may be used in place of a main memory portion that is retired. In a case where such a memory location has not been retired, at block 240, the data path may direct a data read/write process to a location in a main memory portion corresponding to an address transmitted by a processor. Such directing may be performed by an appropriately switched hardware switching component, such as a multiplexer, for example. For example, a signal may be applied to a hardware switching component to select a data path that leads to a main memory portion corresponding to an address transmitted by the processor. Other data paths selected by the hardware switching component may comprise individual data paths leading to different portions of a memory device, such as a spare memory portion, for example.

As a result, at block 250, the read/write address transmitted by the processor may be used to read from or write to the main memory portion of the memory device. Subsequently, at block 260, data read from the read address of the memory device may be provided to error-checking hardware and/or software, such as an ECC decoder and/or other such error correcting algorithms, for example. In one implementation, data read from a memory device may result from a write process to the memory device, wherein such data may be read in order to verify whether the former write process was successful, for example.

In a case where a memory location has been retired, at block 245, a data path may direct a data read/write process to a location in a spare memory portion instead of a memory location corresponding to an address transmitted by a processor. Such path directing may be performed by an appropriately switched hardware switching component, such as a multiplexer, for example. In particular, a signal may be applied to such a hardware switching component to select a data path that leads to a spare memory portion corresponding to an address transmitted by a processor. Other data paths selected by the hardware switching component may comprise individual data paths leading to different portions of a memory device, such as a main memory portion and/or other spare memory portions, for example.

As a result, at block 255, the read/write address transmitted by the processor, though originally directed to an address of a main memory portion, may be redirected to a spare memory portion of the memory device. Subsequently, at block 260, data read from or written to the spare memory portion may be provided to error-checking hardware and/or software, such as an ECC decoder and/or other such error correcting algorithms, for example. In one implementation, data read from a memory device may result from a write process to the memory device, wherein such data may be read in order to verify whether the former write process was successful, for example. Of course, details of such a memory read process are merely examples, and claimed subject matter is not so limited.

Figure 3:
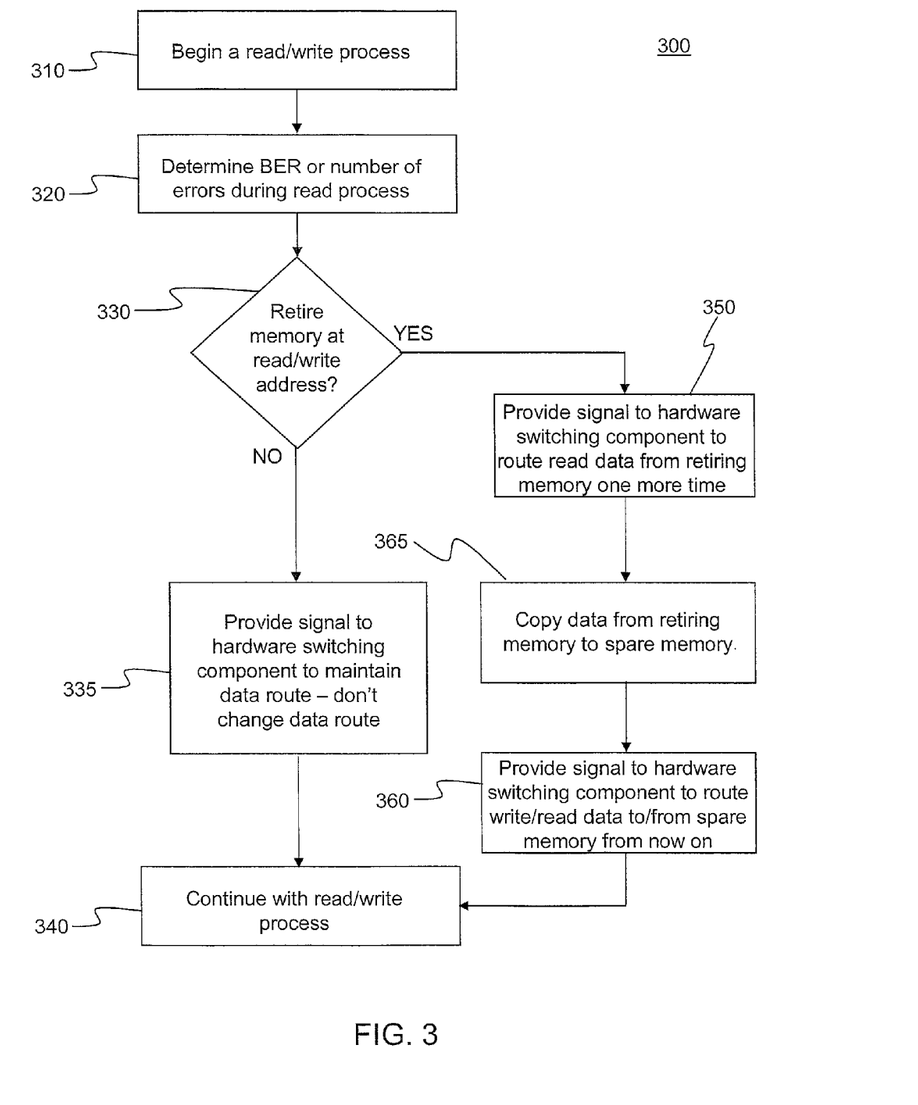
FIG. 3 is a flow diagram of a memory read/write process, according to another embodiment.

FIG. 3 is a flow diagram of a memory read/write process 300, according to an embodiment. At block 310, a read/write process to read/write to a portion of a memory device may be initiated, for example, by a system application that provides one or more read/write addresses to respectively identify one or more memory locations from where stored data is to be read or to where data is to be written. ECC hardware and/or software, by parity checking read data for example, may be used to check and/or correct errors in read data. Subsequently, initially read data may be compared to corrected read data to determine the number of errors that occurred in the memory read process, as at block 320. Such a number of errors may be expressed as a bit error rate (BER), which may comprise a ratio of the number of error bits to the total number of read bits, for example. A BER or number of errors resulting from reading from a portion of a memory device may be compared to an error threshold value, which may comprise a value that represents a maximum acceptable BER or maximum acceptable number of errors, beyond which, for example, additional errors may not be successfully corrected: such an error threshold value may comprise a number that represents a substantially upper limit of a BER or a number of errors that are correctable for a particular memory device, such as memory device 100 shown in FIG. 1, for example. At or below such an error threshold value, ECC hardware and/or software may be capable of correcting read errors. But above such an error threshold, there may be a relatively high probability that all read errors may not be correctable. In one implementation, the above-described process of reading data from a memory device may be part of a write process to the memory device. In such a case, reading such data may be performed in order to verify whether the former write process was successful, for example.

At block 330, a decision is made regarding whether to retire a portion of memory based at least in part on whether reading from such a portion of memory results in too many errors. If such a number of errors is at or below an error threshold, then a decision may be made to not retire such a portion of memory, and read process 300 may proceed to block 335. Here, a signal may be provided to hardware switching component so that a route or path on which data is transmitted for the read/write process may be directed to original main memory portion. Next, at block 340, for example, read data may be provided to an application that requested the read data, for example.

On the other hand, if such a number of errors is above an error threshold, then a decision may be made to retire a portion of memory, and read/write process 300 may proceed to block 350 where, for example, a process may begin to retire such a portion of memory that leads to too many errors. In a particular implementation, data stored in such a to-be-retired memory portion may be read one more time by providing a signal to a hardware switching component so that a data route used for the read process may be directed to original main memory portion. At block 365, data stored in a to-be-retired memory portion may be copied to newly selected spare memory. Accordingly, such data may be available from the spare memory portion for future read/write processes. Next, at block 360, a signal may be provided to hardware switching component so that a data route used for subsequent read and/or write processes may be directed to a spare memory portion used to replace the original main memory portion. Next, at block 340, for example, read data may be provided to an application that requested the read data. Of course, details of such a memory read process are merely examples, and claimed subject matter is not so limited.

Figure 4:
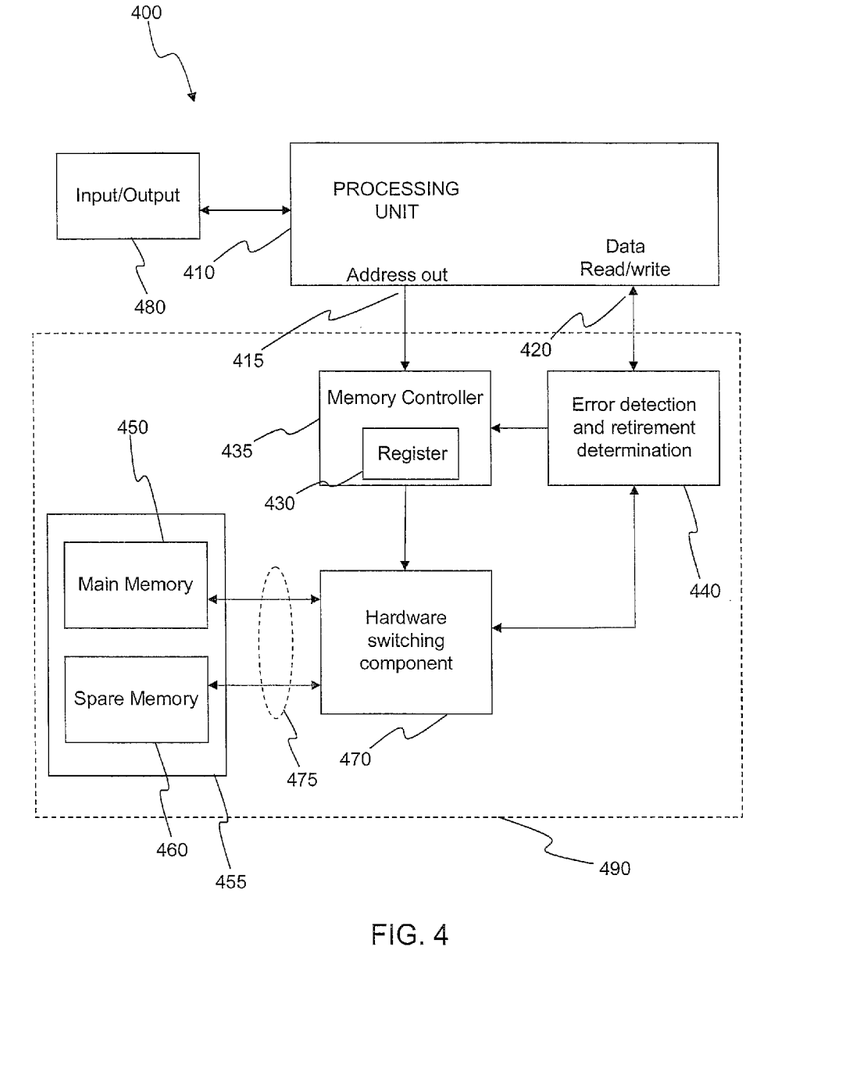
FIG. 4 is a schematic block diagram of a computing system and a memory device, according to an embodiment.

FIG. 4 is a schematic diagram illustrating an embodiment of a computing system 400 including a memory device 455, which may be partitioned into main portion 450 and a spare portion 460 as discussed above regarding FIG. 1, for example. A computing system 400 may be representative of any device, appliance, and/or machine that may be configurable to manage memory device 455. By way of example but not limitation, computing system 400 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in computing system 400, and the processes and methods as further described herein, may be implemented using or otherwise including hardware, firmware, software, or any combination thereof. Thus, by way of example but not limitation, computing system 400 may include at least one processing unit 410 that is operatively coupled to memory 455 through a hardware switching component 470, a memory controller 435, and an error detection and memory retirement determination component 440 (hereinafter named "error detection component" for convenience). Processing unit 410 may be representative of one or more circuits configurable to perform at least a portion of a data computing procedure or process. By way of example but not limitation, processing unit 410 may include one or more processors, controllers, microprocessors, microcontrollers, application specific integrated circuits, digital signal processors, programmable logic devices, field programmable gate arrays, and the like, or any combination thereof. Processing unit 410 may communicate with memory controller 435 to process memory-related operations, such as read, write, and/or erase, for example. Processing unit 410 may include an operating system configured to communicate with memory controller 435. Such an operating system may, for example, generate commands to be sent to memory controller 435 via address output port 415 and/or data read/write port 420. Such commands may include a memory address corresponding to memory 455, for example.

Computing system 400 may include, for example, an input/output portion 480, which may represent one or more devices or features configurable to accept or otherwise introduce human and/or machine inputs, and/or one or more devices or features configurable to deliver or otherwise provide for human and/or machine outputs. By way of example but not limitation, input/output portion 480 may include an operatively configured display, speaker, keyboard, mouse, trackball, touch screen, data port, etc.

Memory controller 435 may include a register 430 to maintain information to be used to select, via hardware switching component 470, among multiple data paths 475 leading to various portions of memory 455. For example, such information may comprise a table of memory addresses associated with particular memory selection values to select particular data paths 475; if processing unit 410 presents an address as part of a read/write operation, register 430 may be used to associate the address with a particular memory selection value to select a particular data path to memory. Here, for example, a selection may be made to choose a data path to either main memory 450 or spare memory 460. Such a selection, as indicated above, may be based, at least in part, on whether a location of memory 455 associated with an address presented in a read/write process has been retired. To illustrate by a particular example, processing unit 410 may present an address as part of a read operation. The address, received by memory controller 435, may then be associated with a particular memory selection value maintained in register 430. As explained below, such a memory selection value may have been established based, at least in part, on information provided by error detection component 440. Such a memory selection value may then be provided to hardware switching component 470 to select one data path to memory among multiple data paths 475. In the present particular example, the address corresponds to a location of memory 455 previously retired. Accordingly, register 430 may associate the address with a memory selection value that, if presented to hardware switching component 470, will select a data path leading to a location in spare memory 460. Although two data paths are shown to represent multiple data paths 475 in FIG. 4, it should be noted that any number of data paths may be possible. Also, hardware switching component 470 need not be limited to selecting one data path at a time. Similarly, combinations including any number of data paths to any portion of memory 455 are possible, wherein memory 455 may comprise one or more memory devices packaged together or individually, for example. Memory 455 may be representative of any data storage mechanism. Memory 455 may include, for example, a disk drive, an optical disc drive, a tape drive, a solid state memory drive, etc. Accordingly, configurations described herein are merely examples, and claimed subject matter is not so limited.

As indicated above, register 430 may establish and maintain information based, at least in part, on information provided by error detection component 440. In one embodiment, data read from memory 455 may be provided to error detection component 440, which may check for errors to determine a bit error rate and/or the number of bit errors associated with reading a particular portion of memory 455. Such error information may then be provided to memory controller 435, which may compare the bit error rate and/or number of bit errors to an error threshold, for example. Depending on an outcome of such a comparison, a decision may be made regarding whether to retire the particular portion of memory. Accordingly, the address of the particular portion of memory may be associated with a memory selection value that, if presented to hardware switching component 470, may be used to select a data path to an appropriate portion of memory. As described above, register 430 may maintain such memory selection values associated with particular memory addresses.

As shown in FIG. 4, computing system 400 may comprise a hardware portion 490 that includes, for example, memory controller 435, register 430, hardware switching component 470, and/or memory 455. In a particular embodiment, retiring a portion of a memory device and/or determining whether to read/write to/from main or spare memory may comprise a process that is transparent with respect to processing unit 410, which may issue read/write instructions. Accordingly, processor unit 410 need not receive nor process data read from a particular portion of memory that produces errors. Instead, such errors may be intercepted and detected by error detection component 440, which may then provide error information to memory controller 435, as described above. Subsequently, memory controller 435 may determine whether a particular portion of memory 455 should be retired, wherein such a determination may be made within hardware portion 490 and without participation of processing unit 410, for example. In addition, memory controller 435 may determine whether to read/write to/from main or spare memory depending, at least in part, on signals representative of information stored in register 430. Again, such a determination may be made within hardware portion 490 and without participation of processing unit 410. Accordingly, as indicated above, a processor need not be burdened with software processes to reorganize and/or work with memory maps while processing read/write instructions, for example. Of course, such processes are merely examples, and claimed subject matter is not so limited.

Figure 5:
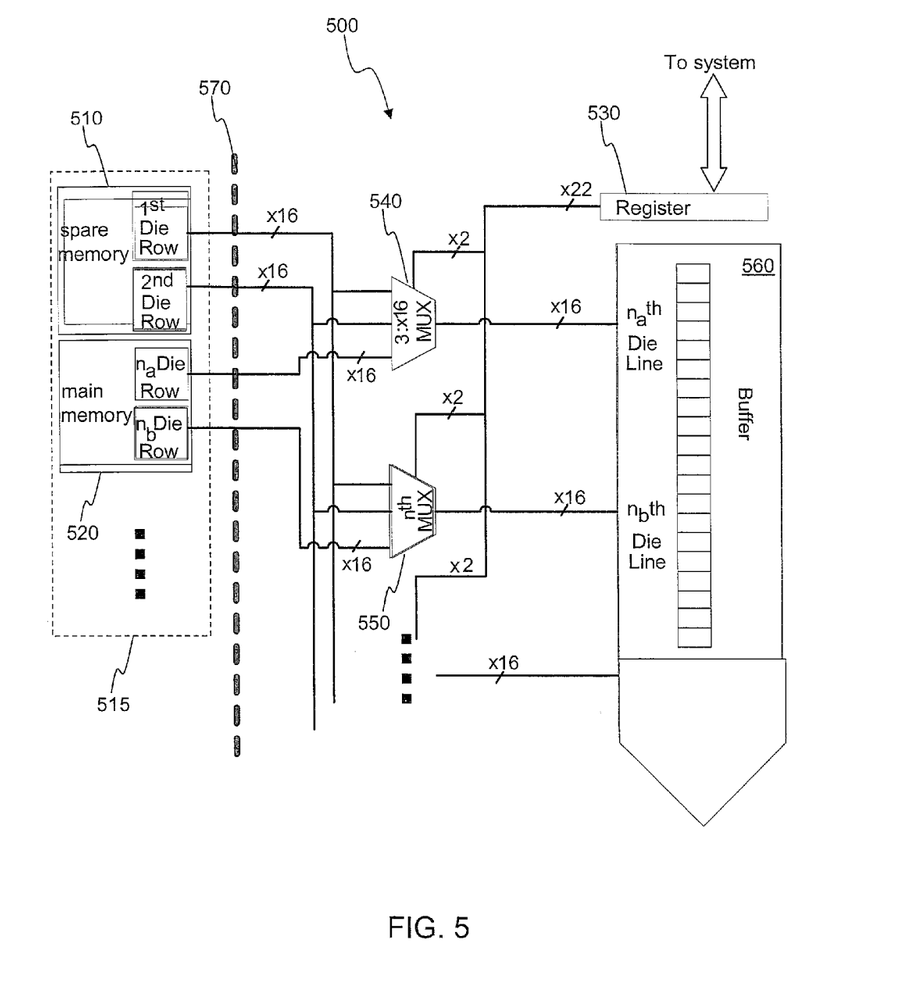
FIG. 5 is a schematic block diagram of a memory system, according to an embodiment.

FIG. 5 is a block diagram of a memory system 500, according to another embodiment. A processor (not shown in FIG. 5) and error detection circuitry may communicate with a register 530, which may operate hardware switching components 540 and 550. In the example shown in FIG. 5, hardware switching components 540 and 550 comprise multiplexers that may be used to select among multiple data paths respectively electrically coupled to various portions of memory 515. Such data paths may link portions of memory 515 to a data buffer 560 that may provide read data to a processor, for example, or write data to the memory.

Memory system 500 may allow a processor or other external requester of data stored in memory to receive error-free data from a particular requested address range even if a portion of such an address range comprises retired main memory. In such a case, for example, a chunk of data may be read from both main memory and spare memory (that replaced retired main memory) without requester knowledge.

Though only a spare memory portion 510 and one main memory portion 520 of memory 515 are shown, additional memory portions may be present. For example, memory system 500 may comprise twenty main memory portions for every one spare memory portions, though claimed subject matter is not limited to such a particular example. Individual memory portions may comprise a single die, so that memory 515 comprises a memory module including multiple memory die. In a particular implementation, main memory portion 520 and spare memory portion 510 may comprise individual die that include multiple die rows, though other memory configurations are possible. In one particular implementation, memory 515 may also comprise a separate die comprising hardware switching components 540 and 550 and/or register 530. In another particular implementation, to the left of line 570 in FIG. 5, memory 515 may comprise multiple die for individual memory devices, for example. To the right of line 570, a hardware portion of memory system 500, comprising register 530 and hardware switching components 540 and 550, for example, may determine memory location retirement and/or selection of memory locations across multiple memory devices. Of course, such a memory system configuration is merely an example, and claimed subject matter is not so limited.

In the above detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Some portions of the detailed description above are presented in teal's of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments. Embodiments described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A system comprising:
   a processor to process executable instructions to read and/or write data;
   a main memory portion and a spare memory portion to store signals representative of said data;
   a register to receive from an error detection component, and to store, signals representative of bit errors detected during a read process;
   a multiplexer to physically redirect information of a read or write process from/to a data path of a single row of said main memory portion to/from a data path of a single row of said spare memory portion during processing of said executable instructions, wherein said multiplexer performs said data path redirection based, at least in part, on said signals stored in said register; and
   a memory module comprising said main memory portion, said spare memory portion, and additional memory portions residing on multiple dies, wherein individual die among said multiple dies include additional multiplexers, and wherein said signals stored in said register are used to operate said additional multiplexers.

2. The system of claim 1, wherein said data paths are determined independently of said processor.

3. The system of claim 1, wherein said error detection component detects whether said main memory portion is generating at least a threshold number of errors.

4. The system of claim 3, wherein said error detection component comprises an error correction coding (ECC) decoder to receive read data from said main memory portion and to determine a bit error rate and/or a number of bit errors associated with said read data.

5. The system of claim 1, wherein said processor and said register are disposed on separate dies.

6. The system of claim 1, wherein said main memory portion and said spare memory portion comprise phase change memory (PCM).

7. A method comprising:
   receiving one or more signals representative of a read or write command to read or write from/to a first row of a main memory portion; and
   determining whether to apply a signal to a multiplexer to transmit said read or write command to a second row of a spare memory portion instead of said first row, wherein said determining is based at least in part on signals stored in a register, said signals being representative of bit errors detected during a process of reading said first row, wherein said main memory portion or said spare memory portion reside on multiple dies and individual die among said multiple dies include additional multiplexers, and wherein said signals stored in said register are used to operate said additional multiplexers.

8. The method of claim 7, further comprising:
   maintaining information regarding whether portions of said main memory portion are retired; and
   operating said multiplexer based at least in part on said information.

9. The method of claim 8, further comprising:
   operating a processor to initiate transmission of one or more signals representative of said read or write command, wherein said operating said multiplexer is performed independently of said processor.

10. The method of claim 9, wherein said processor and said multiplexer are disposed on separate dies.

11. The method of claim 7, wherein said main memory portion or said spare memory portion comprises a phase change memory (PCM).

12. The method of claim 7, wherein said determining is based at least in part on whether said first row of said main memory portion is retired.

13. An apparatus comprising:
  means for receiving one or more signals representative of a read or write command to read or write from/to a first row of a main memory portion; and
  means for determining whether to apply a signal to a multiplexer to transmit said read or write command to a second row of a spare memory portion instead of said first row, wherein said determining is based at least in part on signals stored in a register, said signals being representative of bit errors detected during a process of reading said first row, wherein said main memory portion or said spare memory portion reside on multiple dies and individual die among said multiple dies include additional multiplexers, and wherein said signals stored in said register are used to operate said additional multiplexers.

14. The apparatus of claim 13, further comprising:
  means for maintaining information regarding whether portions of said main memory portion are retired; and
  means for operating said multiplexer based at least in part on said information.

15. The apparatus of claim 14, further comprising:
  means for operating a processor to initiate transmission of one or more signals representative of said read or write command, wherein said operating said multiplexer is performed independently of said processor.

16. The apparatus of claim 15, wherein said processor and said multiplexer are disposed on separate dies.

17. The apparatus of claim 13, wherein said main memory portion or said spare memory portion comprises a phase change memory (PCM).

18. The apparatus of claim 13, wherein said means for determining is based at least in part on whether said first row of said main memory portion is retired.

* * * * *